United States Patent
Schlautmann et al.

(10) Patent No.: US 11,389,831 B2
(45) Date of Patent: Jul. 19, 2022

(54) TRANSFORMERLESS ULTRASONIC TRANSDUCER ACTIVATION WITH ONLY ONE EXTERNAL ENERGY STORE

(71) Applicant: ELMOS Semiconductor SE, Dortmund (DE)

(72) Inventors: Guido Schlautmann, Altenberge (DE); André Schmidt, Wiehl (DE); Stefanie Heppekausen, Essen (DE)

(73) Assignee: ELMOS SEMICONDUCTOR SE, Dortmund (DE)

( * ) Notice: Subject to any disclaimer, the term of this patent is extended or adjusted under 35 U.S.C. 154(b) by 77 days.

(21) Appl. No.: 17/155,290

(22) Filed: Jan. 22, 2021

(65) Prior Publication Data

US 2022/0040732 A1 Feb. 10, 2022

(30) Foreign Application Priority Data

Aug. 5, 2020 (DE) .......................... 102020120716.6

(51) Int. Cl.
  *H02M 3/07* (2006.01)
  *B06B 1/02* (2006.01)
  *H03K 17/51* (2006.01)

(52) U.S. Cl.
  CPC ............ *B06B 1/0207* (2013.01); *H02M 3/07* (2013.01); *H03K 17/51* (2013.01)

(58) Field of Classification Search
  CPC .................................. H02M 3/07; H03K 17/51
  See application file for complete search history.

(56) References Cited

U.S. PATENT DOCUMENTS

| | | | |
|---|---|---|---|
| 4,588,917 A * | 5/1986 | Ratcliff ................. | B06B 1/0253 318/116 |
| 11,295,105 B2 * | 4/2022 | Yang ..................... | G06F 3/0418 |
| 2012/0170770 A1 | 7/2012 | Lesso et al. | |
| 2017/0285877 A1 * | 10/2017 | Hinger .................. | G01N 29/26 |
| 2018/0182372 A1 * | 6/2018 | Tester .................. | B06B 1/0207 |
| 2022/0052686 A1 * | 2/2022 | Thomsen ........... | H03K 17/6871 |

FOREIGN PATENT DOCUMENTS

| | | |
|---|---|---|
| DE | 102018101519 A1 | 7/2019 |
| EP | 3537177 A1 | 9/2019 |
| WO | 2017070389 A1 | 4/2017 |
| WO | 2017140673 A1 | 8/2017 |

OTHER PUBLICATIONS

Examination Report issued by the Intellectual Property Office of India in the correlated foreign application No. 202144009057 dated Mar. 2, 2022.
German Application No. DE 10 2020 120 716.6, Office Action dated Oct. 19, 2020.

* cited by examiner

*Primary Examiner* — Sibin Chen
(74) *Attorney, Agent, or Firm* — Mindful IP PLLC

(57) ABSTRACT

Disclosed is a driver stage for activating a first ultrasonic transducer and a method for the operation thereof. The driver stage comprises a first charge pump or power source and a first capacitor. The driver stage also comprises first means for charging the first capacitor with electrical energy from the charge pump and second means for connecting the first capacitor and ultrasonic transducer to different polarities. The first means do not charge the first capacitor with energy from the charge pump or power source when the first capacitor is connected to the ultrasonic transducer by the second means.

2 Claims, 2 Drawing Sheets

TRANSFORMERLESS ULTRASONIC TRANSDUCER ACTIVATION WITH ONLY ONE EXTERNAL ENERGY STORE

CROSS REFERENCE TO RELATED APPLICATIONS

This application claims priority to German Application No. DE 10 2020 120 716.6 filed on Aug. 5, 2020, which application is hereby incorporated herein by reference in its entirety.

TECHNICAL FIELD

The disclosure relates to an improved driver stage for transformerless activation of an ultrasonic transducer, in which an external power source and a connection from the prior art can be eliminated.

BACKGROUND

Ultrasonic measurement systems are frequently used in the prior art to detect obstructions and determine distances in parking assistance systems, as well as to detect people, e.g. in spaces, as well as for industrial applications, e.g. monitoring filling levels. An ultrasonic signal is emitted from an ultrasonic transmitter for this. When reflected on an object, the reflected signal can be detected by an ultrasonic receiver. The distance between the transmitter and the object can be determined using a time-of-flight measurement. A single ultrasonic transducer can function as both a transmitter and a receiver.

A cost-effective production of ultrasonic measurement systems is particularly necessary for use in parking assistance systems, because increasingly more ultrasonic measurement systems are being incorporated in new vehicles.

Circuits for activating piezoceramic ultrasonic transducers are well known in the prior art (SdT). A transformerless driver stage for activating an ultrasonic transducer with alternating positive and negative operating voltage is explained in reference to FIG. 1. In this regard, FIG. 1 is first described. Similar functional elements shall be distinguished with numerical words such as "first," "second," "third," etc. for purposes of clarity. These numerical words are therefore to be understood as part of the functional element's name. We refer here to the list of reference symbols.

FIG. 1 shows a transformerless activation of an ultrasonic transducer according to the prior art (SdT). A second driver stage (TR2) comprises a circuit for the transformerless activation of a second ultrasonic transducer (TD2) within a second integrated circuit (IC2). A second capacitor (C2) and third capacitor (C3) are also needed for activating the second ultrasonic transducer (TD2). The second capacitor (C2) and third capacitor (C3) are external circuit components.

The structure of the activation within the second integrated circuit (IC2) shall first be described.

The second integrated circuit (IC2) comprises four connections for connecting internal circuit components to external components. These connections comprise a connection for the second operating voltage (VDRV2), a second signal connection (DRV2), a positive connection (C3P) for the third capacitor (C3), and a negative connection (C3N) for the third capacitor.

The second integrated circuit (IC2) also comprises a second charge pump (CP2), a sixth switch (SW6), a seventh switch (SW7), an eighth switch (SW8), a ninth switch (SW9) and a tenth switch (SW10). Each of these switches have a first connection and a second connection.

The second charge pump (CP2) is connected at a fifth node (K5) to the connection for the second operating voltage (VDRV2) and to the first connection on the tenth switch (SW10) and the first connection on the seventh switch (SW7).

The second connection on the tenth switch (SW10) is connected at a sixth node (K6) to the first connection on the eight switch (SW8) and to the second signal connection (DRV2).

The second connection on the seventh switch (SW7) is connected at a fourth node (K4) to the first connection on the sixth switch (SW6) and to the positive connection (CP3) on the third capacitor (C3).

The second connection on the eighth switch (SW8) is connected at a seventh node to the first connection on the ninth switch (SW9) and to the negative connection (CN3) on the third capacitor (C3).

The second connection on the sixth switch (SW6) and the second connection on the ninth switch (SW9) are connected at an eighth node (K8) to a second ground (GND2).

The second capacitor (C2) comprises two connections. The first connection on the second capacitor (C2) is connected to the connection for the second operating voltage (VDRV2). The second connection on the second capacitor is connected to the second ground (GND2).

The second signal connection (DRV2) is connected to a signal connection (STD2) in the second ultrasonic transducer (TD2).

A ground connection (MTD2) on the second ultrasonic transducer (TD2) is connected to the second ground (GND2).

The second ground (GND2) is lower than the operating voltage (VDRV2) and is preferably equal to 0 V.

The on-board power supply for the vehicle normally only supplies voltages between 6 V and 12 V. In order to excite the second ultrasonic transducer (TD2), significantly higher voltages of more than 20 V must be applied to the signal connection (STD2) for the second ultrasonic transducer (TD2). The internal structure of the second charge pump (CP2) is of no relevance here. These circuits are known from the prior art (SdT). The function of the second charge pump (CP2) is to provide the higher operating voltage (VDRV2) necessary for exciting the ultrasonic transducer from the on-board power supply.

The activation of the second ultrasonic transducer (TD2) as a transmitter comprises three phases and shall be described below. The first phase is only necessary at the start of the initial transmission, while the second and third phases are alternated between during the entire transmission.

The seventh switch (SW7) and ninth switch (SW9) are closed during the first phase. The sixth switch (SW6), eighth switch (SW8), ninth switch (SW9) and tenth switch (SW10) are open. The second charge pump (CP2) is then connected to the connection for the second operating voltage (VDRV2) and to the positive connection (C3P) in the third capacitor (C3). The negative connection (C3N) in the third capacitor (C3) is connected to the second ground (GND2). The second capacitor (C2) and the third capacitor (C3) are charged.

In the second phase, the second ultrasonic transducer (TD2) is activated with a negative voltage, i.e. there is a negative operating voltage at the signal connection (STD2) in the second ultrasonic transducer (TD2), which is stored on the capacitor C3. The sixth switch (SW6) and the eighth switch (SW8) are closed for this. The seventh switch (SW7), the ninth switch (SW9) and the tenth switch (SW10) are open for this. The negative connection (C3N) in the third capacitor (C3) is connected to the signal connection (STD2) in the second ultrasonic transducer (TD2) by the closed eighth switch (SW8). The positive connection (C3P) in the third capacitor (C3) is connected to the second ground (GND2) by the closed sixth switch (SW6). The negative operating voltage is therefore applied to the signal connection (STD2) in the second ultrasonic transducer (TD2) in the second phase.

In the third phase, the second ultrasonic transducer (TD2) is activated with a positive operating voltage, i.e. the positive operating voltage is applied to the signal connection (STD2) in the second ultrasonic transducer (TD2). The seventh switch (SW7), the tenth switch (SW10) and the ninth switch (SW9) are closed for this. The sixth switch (SW6) and the eight switch (SW8) are open. The second signal connection (DRV2) is connected to the connection for the second operating voltage (VDRV2) and the output for the second charge pump (CP2) through the closed tenth switch (SW10). The positive second operating voltage (VDRV2) is therefore applied to the signal connection (STD2) for the second ultrasonic transducer (TD2). The closed seventh switch (SW7) connects the positive connection (C3P) in the third capacitor (C3) to the connection for the second operating voltage (VDRV2). The closed ninth switch (SW9) connects the negative connection (C3N) in the third capacitor (C3) to the second ground (GND2). The third capacitor is therefore charged during the third phase.

The second capacitor (C2) is charged exclusively by the second charge pump (CP2). Theoretically, a simultaneous activation of the second transducer (TD2) and a charging of the second capacitor (C2) is possible in the activation described according to the prior art (SdT). This is not feasible in practice, and is not done. This raises the question of whether the second capacitor (C2) can be eliminated.

SUMMARY

Based on this, the fundamental object of the disclosure is to create a solution in which an external capacitor can be eliminated by altering the switch configuration within the driver stage. This object is achieved by a device according to claim 1 and a method according to claim 2.

The object of eliminating an external capacitor, and therefore a connection as well, to reduce costs, is achieved according to the disclosure in that the external capacitor used for exchanging the poles the of the voltages applied to the ultrasonic transducer is also used as an energy source. This approach is novel for the person skilled in the art, and has not yet been used in the prior art.

An exemplary circuit design for the driver stage according to the disclosure is shown in FIG. 2.

A first driver stage (TR1) according to the disclosure for activating a first ultrasonic transducer (TD1) comprises a first charge pump (CP1), a first switch (SW1), a second switch (SW2), a third switch (SW3), a fourth switch (SW4) and a fifth switch (SW5). Each of these switches has at least a first and a second connection.

The first driver stage (TR1) according to the disclosure also comprises a first capacitor (C1) that has a positive connection (C1P) for the first capacitor (C1), a negative connection (C1N) for the first capacitor (C1), a first signal connection (DRV1), a first node (K1), a second node (K2), a third node (K3) and a first ground (GND1).

The first charge pump (CP1) is connected to the first connection on the second switch (SW2). The second connection on the second switch (SW2) is connected at the first node (K1) to the first connection on the first switch (SW1) and to the positive connection (C1P) on the first capacitor (C1) and to the first connection on the fifth switch (SW5).

The second connection on the first switch (SW1) is connected to the first ground (GND1).

The second connection on the fifth switch (SW5) is connected at the second node (K2) to the first signal connection (DRV1) and to the first connection on the third switch (SW3).

The second connection on the third switch (SW3) is connected at the third node (K3) to the first connection on the fourth switch (SW4) and to the negative connection (C1N) on the first capacitor (C1).

The second connection on the fourth switch (SW4) is connected to the first ground (GND1).

The first signal connection (DRV1) is connected to a signal connection (STD1) on the first ultrasonic transducer (TD1). A ground connection (MTD1) on the first ultrasonic transducer (TD1) is connected to the first ground (GND1).

The first ground (GND1) is preferably 0 V.

The voltage at the output from the first charge pump (CP1) is preferably more than 20 V.

The first charge pump (CP1), the first switch (SW1), the second switch (SW2), the third switch (SW3), the fourth switch (SW4), the fifth switch (SW5), the first node (K1), the second node (K2), the third node (K3) and the first signal output (DRV1) are preferably implemented in a first integrated circuit (IC1).

The first capacitor (C1) and the first ultrasonic transducer (TD1) are not part of the first integrated circuit (IC1).

The first switch (SW1), the second switch (SW2), the third switch (SW3), the fourth switch (SW4), and the fifth switch (SW5) are formed by microelectronic components that preferably have bipolar or field effect transistors.

The first capacitor (C1) is predominantly a capacitive impedance.

A method for activating the first ultrasonic transducer (TD1) by the first driver stage (TR1) to transmit ultrasonic signals comprises three phases. The last two phases can be repeated cyclically. The three phases shall be described below.

In the first phase, the first capacitor (C1) is charged with the output voltage from the first charge pump (CP1). The second switch (SW2) and the fourth switch (SW4) are closed for this. The closed second switch (SW2) connects the positive connection on the first capacitor (C1P) to the output for the first charge pump (CP1). The closed fourth switch (SW4) connects the negative connection (C1N) on the first capacitor (C1) to the first ground (GND1). The first switch (SW1), the third switch (SW3), and the fifth switch (SW5) are open.

The negative voltage from the first capacitor (C1) is applied to the signal connection (STD1) on the first ultrasonic transducer (TD1) in the second phase. The first switch (SW1) and the third switch (SW3) are closed for this. The closed first switch (SW1) connects the positive connection (C1P) on the first capacitor (C1) to the first ground (GND1). The closed third switch (SW3) connects the negative connection (C1N) on the first capacitor (C1) to the first signal connection (DRV1). The first signal connection (DRV1) is connected to the signal connection (STD1) on the first ultrasonic transducer (TD1). The second switch (SW2), the fourth switch (SW4), and the fifth switch (SW5) are open.

The positive voltage from the first capacitor (C1) is applied to the signal connection (STD1) on the first ultrasonic transducer (TD1) in the third phase. The fourth switch (SW4) and the fifth switch (SW5) are closed for this. The closed fourth switch (SW4) connects the negative connection (C1N) on the first capacitor (C1) to the first ground (GND1). The closed fifth switch (SW5) connects the positive connection (C1P) on the first capacitor (C1) to the first signal connection (DRV1). The first signal connection (DRV1) is connected to the signal connection (STD1) on the first ultrasonic transducer (TD1). The first switch (SW1), the second switch (SW2), and the third switch (SW3) are open.

The first phase is only necessary at the initial transmission start, while the second and third phases are repeated alternatingly during the entire transmission.

The first capacitor (C1) serves as an energy source for the ultrasonic transducer during the entire transmission process, because after the first phase is complete, the first charge pump (CP1) is no longer connected to.

The method for activating a first ultrasonic transducer (TD1) to transmit ultrasonic signals by a driver stage can therefore be described in brief in that it comprises a first phase for charging a first capacitor (C1) with the output voltage from the first charge pump (C1), a second phase for applying the negative voltage from the first capacitor (C1) to the first ultrasonic transducer (TD1), and a third phase for applying the positive voltage from the first capacitor (C1) to the signal connection (STD1) for the first ultrasonic transducer (TD1). The first phase is carried out only once, at the start of the transmission. The second phase and third phase are carried out alternatingly over the course of the entire transmission. The transmissions can also be repeated cyclically. The phase first following the first phase can be the second phase or third phase. After an arbitrary number of cyclical repetitions of the second and third phases, further phases may take place. These comprise, e.g. a receiving phase, and potentially a damping phase. These phases shall not be explained in greater detail herein, however.

The device comprising the driver stage for activating a first ultrasonic transducer (TD1) comprises, in brief, a first charge pump (CP1) or power source, a first capacitor (C1), first means (SW2, SW4) for charging the first capacitor (CP1) with electrical energy from the charge pump (CP1) or the power source, and second means (SW1, SW3, SW4, SW5) for connecting the first capacitor (CP1) and first ultrasonic transducer (TD1) to different polarities. The first means (SW2, SW4) do not charge the first capacitor (C1) with electrical energy from the charge pump (CP1) or power source when the first capacitor (CP1) is connected to the ultrasonic transducer (TD1) by the second means (SW1, SW3, SW4, SW5), in order to prevent malfunctions. This operation of the ultrasonic transducer via only the first capacitor (C1), without connecting to another power source, is novel to the person skilled in the art.

Such an improved driver stage for activating an ultrasonic transducer allows for an external capacitor and a connection pin in the integrated circuit for the driver stage to be eliminated. As a result, the system costs are reduced, and the PCB design is simplified.

DESCRIPTION

FIG. 1

Figure 1:
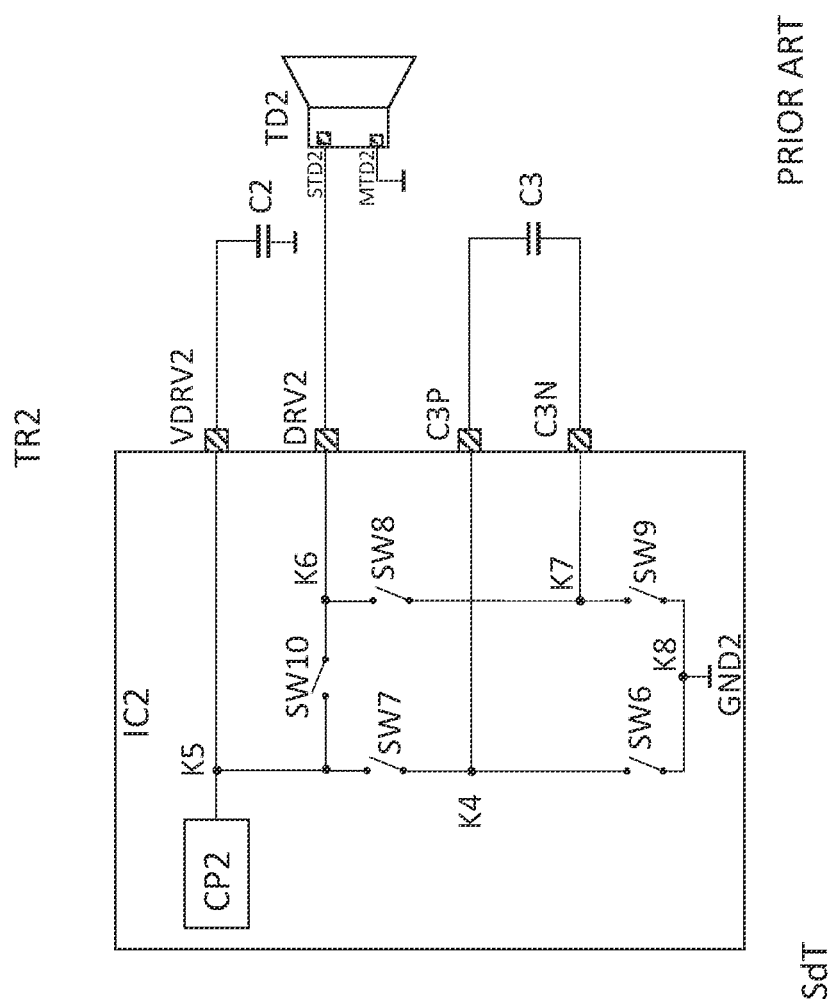
FIG. 1 shows an exemplary transformerless activation of an ultrasonic transducer according to the prior art (SdT).

FIG. 1 shows an exemplary transformerless activation of an ultrasonic transducer according to the prior art (SdT). A second driver stage (TR2) comprises a circuit for a transformerless activation of a second ultrasonic transducer (TD2) in a second integrated circuit (IC2). An additional second capacitor (C2) and third capacitor (C3) are needed to activate the second ultrasonic transducer (TD2). The second capacitor (C2) and third capacitor (C3) are external circuit components.

First, the structure of the activation within the second integrated circuit (IC2) shall be described.

The second integrated circuit (IC2) comprises four connections for connecting internal circuit components to external components. These connections comprise a connection for the second operating voltage (VDRV2), a second signal connection (DRV2), a positive connection (C3P) for the third capacitor (C3), and a negative connection (C3N) for the third capacitor.

The second integrated circuit (IC2) also comprises a second charge pump (CP2), a sixth switch (SW6), a seventh switch (SW7), an eighth switch (SW8), a ninth switch (SW9), and a tenth switch (SW10). Each of these switches has a first connection and a second connection.

The second charge pump (CP2) is connected at a fifth node (K5) to the connection for the second operating voltage (VDRV2), the first connection on the tenth switch (SW10), and the first connection on the seventh switch (SW7).

The second connection on the tenth switch (SW10) is connected at a sixth node (K6) to the first connection on the eighth switch (SW8) and the second signal connection (DRV2).

The second connection on the seventh switch (SW7) is connected at a fourth node (K4) to the first connection on the sixth switch (SW6) and the positive connection (C3P) on the third capacitor (C3).

The second connection on the eighth switch (SW8) is connected at a seventh node (K7) to the first connection on the ninth switch (SW9) and the negative connection (C3N) on the third capacitor (C3).

The second connection on the sixth switch (SW6) and the second connection on the ninth switch (SW9) are connected at an eighth node (K8) to a second ground (GND2).

The second capacitor (C2) comprises two connections. The first connection on the second capacitor (C2) is connected to the connection for the second operating voltage (VDRV2). The second connection on the second capacitor is connected to the second ground (GND2).

The second signal connection (DRV2) is connected to a signal connection (STD2) on the second ultrasonic transducer (TD2).

A ground connection (MTD2) on the second ultrasonic transducer (TD2) is connected to the second ground (GND2).

FIG. 2

Figure 2:
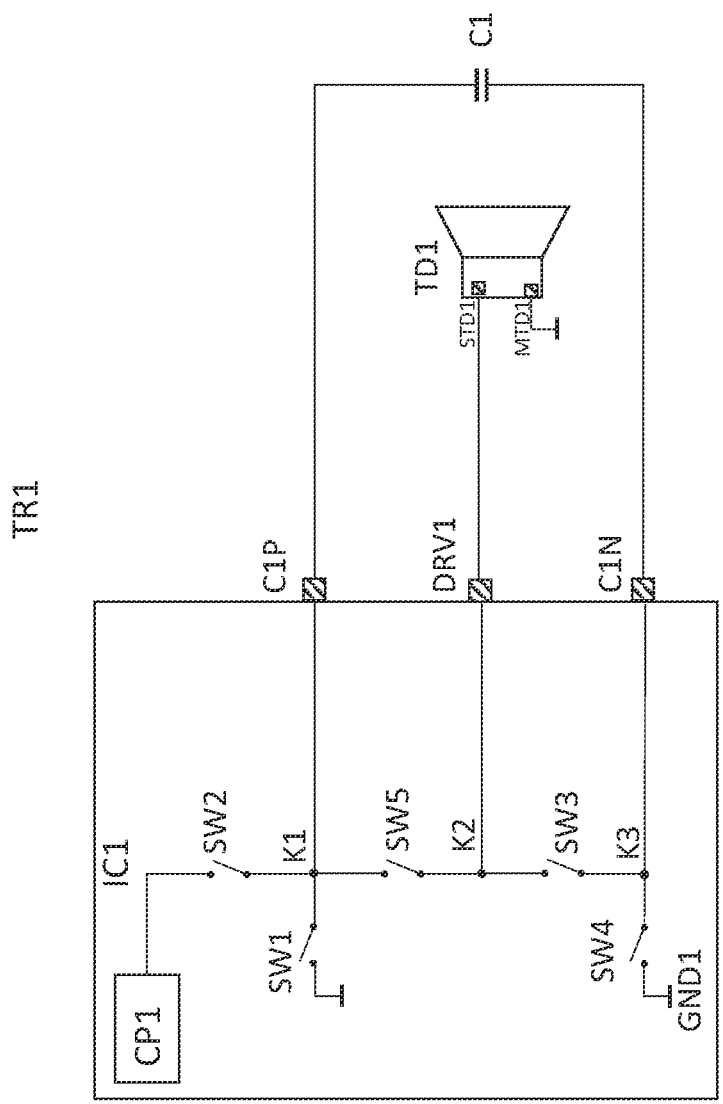
FIG. 2 shows an exemplary transformerless activation of an ultrasonic transducer according to the disclosure, with an improved switch arrangement within the integrated circuit with respect to the prior art (SdT).

FIG. 2 shows an exemplary transformerless activation of an ultrasonic transducer according to the disclosure, with an improved switch arrangement within the integrated circuit with respect to the prior art (SdT). As a result, a connection to the integrated circuit and an external capacitor can be eliminated.

A first driver stage (TR1) comprises a circuit for transformerless activation of a first ultrasonic transducer (TD1) within a first integrated circuit (IC1). An additional first capacitor (C1) is needed to activate the first ultrasonic transducer (TD1). The first capacitor (C1) is an external circuit component.

The structure of the activation within the first integrated circuit (IC1) shall first be described.

The first integrated circuit (IC1) comprises three connections for connecting internal circuit components to external circuit components. These connections comprise a first signal connection (DRV1), a positive connection (C1P) for the first capacitor (C1), and a negative connection (C1N) for the first capacitor (C1).

The first integrated circuit (IC1) also comprises a first charge pump (CP1), a first switch (SW1), a second switch (SW2) a third switch (SW3), a fourth switch (SW4), and a fifth switch (SW5). Each of these switches have a first and second connection.

The first charge pump (CP1) is connected to the first connection on the second switch (SW2).

The second connection on the second switch (SW2) is connected at a first node (K1) to the first connection on the first switch (SW1), the positive connection (C1P) on the first capacitor (C1), and the first connection on the fifth switch (SW5).

The second connection on the first switch (SW1) is connected to the first ground (GND1).

The second connection on the fifth switch (SW5) is connected at a second node (K2) to the first signal connection (DRV1) and the first connection on the third switch (SW3).

The second connection on the third switch (SW3) is connected at a third node (K3) to the first connection on a fourth switch (SW4) and to the negative connection (C1N) on the first capacitor (C1).

The second connection on the fourth switch (SW4) is connected to the first ground (GND1).

The first signal connection (DRV1) is connected to a signal connection (STD1) on the first ultrasonic transducer (TD1). A ground connection (MTD1) for the first ultrasonic transducer (TD1) is connected to the first ground (GND1).

LIST OF REFERENCE SYMBOLS

STD1 signal connection (STD1) for the first ultrasonic transducer (TD1);
STD2 signal connection (STD2) for the second ultrasonic transducer (TD2);
MTD1 ground connection (MTD1) for the first ultrasonic transducer (TD1);
MTD2 ground connection (MTD2) for the second ultrasonic transducer (TD2);
C1 first capacitor;
C1N negative connection (C1N) for the first capacitor (C1);
C1P positive connection (C1P) for the first capacitor (C1);
C2 second capacitor;
C3 third capacitor;
C3P positive connection (C3P) for the third capacitor (C3);
C3N negative connection (C3N) for the third capacitor (C3);
CP1 first charge pump;
CP2 second charge pump;
DRV1 first signal connection;
DRV2 second signal connection;
IC1 first integrated circuit;
IC2 second integrated circuit;
GND1 first ground;
GND2 second ground;
K1 first node;
K2 second node;
K3 third node;
K4 fourth node;
K5 fifth node;
K6 sixth node;
K7 seventh node;
K8 eighth node;
SdT prior art;
SW1 first switch;
SW2 second switch;
SW3 third switch;
SW4 fourth switch;
SW5 fifth switch;
SW6 sixth switch;
SW7 seventh switch;
SW8 eighth switch;
SW9 ninth switch;
SW10 tenth switch;
TD1 first ultrasonic transducer;
TD2 second ultrasonic transducer;
TR1 first driver stage;
TR2 second driver stage;
VDRV2 second operating voltage;

What is claimed is:

1. A driver stage for activating a first ultrasonic transducer (TD1), comprising:
   a first charge pump (CP1);
   a first switch (SW1) that has at least a first connection and a second connection;
   a second switch (SW2) that has at least a first connection and a second connection;
   a third switch (SW3) that has at least a first connection and a second connection;
   a fourth switch (SW4) that has at least a first connection and a second connection;
   a fifth switch (SW5) that has at least a first connection and a second connection;
   a first capacitor (C1) that has a positive connection (C1P) for the first capacitor (C1) and a negative connection (C1N) for the first capacitor;
   a first signal connection (DRV1);
   a first node (K1);
   a second node (K2);
   a third node (K3); and
   a first ground (GND1);
   wherein the first charge pump (CP1) is connected to the first connection on the second switch (SW2);
   wherein the second connection on the second switch (SW2) is connected at the first node (K1) to the first connection on the first switch (SW1), the positive connection (C1P) on the first capacitor (C1), and the first connection on the fifth switch (SW5);
   wherein the second connection on the first switch (SW1) is connected to the first ground (GND1);
   wherein the second connection on the fifth switch (SW5) is connected at the second node (K2) to the first signal connection (DRV1) and the first connection on the third switch (SW3);
   wherein the second connection on the third switch (SW3) is connected at the third node (K3) to the first connection on the fourth switch (SW4) and the negative connection (C1N) for the first capacitor (C1);
   wherein the second connection on the fourth switch (SW4) is connected to the first ground (GND1);
   wherein the first signal connection (DRV1) is connected to a signal connection (STD1) on the first ultrasonic transducer (TD1); and
   wherein a ground connection (MTD1) for the first ultrasonic transducer (TD1) is connected to the first ground (GND1).

2. A method for activating a first ultrasonic transducer (TD1) to transmit ultrasonic signals through a driver stage, comprising:
- a first phase for charging a first capacitor (C1) with an output voltage of a first charge pump (CP1) by connecting a positive connection (C1P) on the first capacitance (C1) to an output on the first charge pump (CP1) by closing a second switch (SW2) and by connecting a negative output (C1N) on the first capacitor (C1) to a first ground (GND1) by closing a fourth switch (SW4), while a first switch (SW1), a third switch (SW3), and a fifth switch (SW5) are open;
- a second phase for applying a negative voltage from the first capacitor (C1) to a signal connection (STD1) for the first ultrasonic transducer (TD1) by connecting the negative connection (C1N) on the first capacitor (C1) to the signal connection (STD1) on the first ultrasonic transducer (TD1) by closing the third switch (SW3) and by connecting the positive connection (C1P) on the first capacitor (C1) to the first ground (GND1) by closing the first switch (SW1), while the second switch (SW2), the fourth switch (SW4), and the fifth switch (SW5) are open; and
- a third phase for applying a positive voltage from the first capacitor (C1) to the signal connection (STD1) on the first ultrasonic transducer (TD1) by connecting the positive connection (C1P) on the first capacitor (C1) to the signal connection (STD1) on the first ultrasonic transducer (TD1) by closing the fifth switch (SW5) and by connecting the negative connection (C1N) on the first capacitor (C1) to the first ground (GND1) by closing the fourth switch (SW4) while the first switch (SW1), the second switch (SW2) and the third switch (SW3) are open;
- wherein the first phase is only carried out once at a start of the transmission; and
- wherein the second phase and the third phase are carried out alternatingly over a course of the transmission.

\* \* \* \* \*